United States Patent
Furusho et al.

(10) Patent No.: US 10,035,173 B2
(45) Date of Patent: Jul. 31, 2018

(54) CHEMICAL SUPPLY SYSTEM, SUBSTRATE TREATMENT APPARATUS INCORPORATING THE SAME, AND COATING AND DEVELOPING SYSTEM INCORPORATING THE SAME APPARATUS

(71) Applicant: TOKYO ELECTRON LIMITED, Tokyo (JP)

(72) Inventors: Toshinobu Furusho, Koshi (JP); Takahiro Ookubo, Koshi (JP); Kousuke Yoshihara, Koshi (JP); Yusuke Yamamoto, Koshi (JP); Steffen Hornig, Dresden (DE)

(73) Assignee: Tokyo Electron Limited, Minato-Ku (JP)

( * ) Notice: Subject to any disclaimer, the term of this patent is extended or adjusted under 35 U.S.C. 154(b) by 385 days.

(21) Appl. No.: 14/736,582

(22) Filed: Jun. 11, 2015

(65) Prior Publication Data
US 2015/0279702 A1    Oct. 1, 2015

Related U.S. Application Data

(63) Continuation of application No. 13/695,844, filed as application No. PCT/JP2011/056255 on Mar. 16, 2011, now Pat. No. 9,086,190.

(30) Foreign Application Priority Data

May 6, 2010    (JP) ................................ 2010-106656

(51) Int. Cl.
*B05D 1/02*    (2006.01)
*H01L 21/67*   (2006.01)
(Continued)

(52) U.S. Cl.
CPC ............... *B05D 1/02* (2013.01); *B01D 29/56* (2013.01); *B01D 35/02* (2013.01); *B05C 11/10* (2013.01);
(Continued)

(58) Field of Classification Search
None
See application file for complete search history.

(56) References Cited

U.S. PATENT DOCUMENTS 2,945,445 A    7/1960 Smith et al.
3,400,908 A    9/1968 Bauer
(Continued)

FOREIGN PATENT DOCUMENTS

JP    62-204877 A1    9/1987
JP    04-290432 A1    10/1992
(Continued)

OTHER PUBLICATIONS

International Search Report (Application No. PCT/JP2011/056255) dated Jun. 21, 2011.
(Continued)

*Primary Examiner* — Michael P Rodriguez
(74) *Attorney, Agent, or Firm* — Burr & Brown, PLLC

(57) ABSTRACT

A chemical supply system comprises: a first container and a second container for storing a chemical solution; a first pump, located on a first pipe connecting the first and second containers, for directing the solution stored in the first container to the second container; and a first filter, located in the first pipe, for filtering the solution flowing through the first pipe from the first container toward the second container. The system further includes: a second pipe for connecting the first container and the second container; and a second pump, located on the second pipe, for directing the solution stored in the second container to the first container.

5 Claims, 9 Drawing Sheets

(51) Int. Cl.
*F17D 1/00* (2006.01)
*B01D 29/56* (2006.01)
*B01D 35/02* (2006.01)
*B05C 11/10* (2006.01)
*B05C 9/06* (2006.01)

(52) U.S. Cl.
CPC ............ *F17D 1/00* (2013.01); *H01L 21/6715* (2013.01); *H01L 21/67017* (2013.01); *H01L 21/67173* (2013.01); *H01L 21/67178* (2013.01); *B05C 9/06* (2013.01); *Y10T 137/794* (2015.04)

(56) References Cited

U.S. PATENT DOCUMENTS

| | | | |
|---|---|---|---|
| 4,982,687 A | 1/1991 | Takahashi et al. | |
| 5,309,403 A | 5/1994 | Bartow | |
| 5,482,441 A | 1/1996 | Permar | |
| 5,538,644 A | 7/1996 | Kozak et al. | |
| 6,200,414 B1 | 3/2001 | Hwang et al. | |
| 2004/0045502 A1 | 3/2004 | Yokoyama et al. | |
| 2005/0016201 A1* | 1/2005 | Ivanov | C23C 18/1619 62/434 |
| 2005/0281947 A1 | 12/2005 | Katsuoka et al. | |
| 2007/0175387 A1 | 8/2007 | Kimura | |
| 2008/0169230 A1* | 7/2008 | Nakagawa | B01D 19/0042 210/188 |
| 2008/0210562 A1 | 9/2008 | Kawakami et al. | |
| 2010/0170801 A1 | 7/2010 | Metzger | |

FOREIGN PATENT DOCUMENTS

| | | |
|---|---|---|
| JP | 06-262113 A1 | 9/1994 |
| JP | 2002-045754 A1 | 2/2002 |
| JP | 2006-231212 A1 | 9/2006 |
| JP | 2007-273791 A1 | 10/2007 |
| JP | 2008-208421 A1 | 9/2008 |
| JP | 2008-305980 A1 | 12/2008 |
| WO | 2005/040930 A1 | 5/2005 |

OTHER PUBLICATIONS

Korean Office Action (Application No. 10-20140-7004500) dated Feb. 9, 2015.

* cited by examiner

CHEMICAL SUPPLY SYSTEM, SUBSTRATE TREATMENT APPARATUS INCORPORATING THE SAME, AND COATING AND DEVELOPING SYSTEM INCORPORATING THE SAME APPARATUS

CROSS REFERENCE TO RELATED APPLICATIONS

This application is a continuation of U.S. patent application Ser. No. 13/695,844, filed Dec. 4, 2012, which is the National Stage of International Application No. PCT/JP2011/056255 filed Mar. 16, 2011.

FIELD OF THE INVENTION

The present invention relates to a chemical supply system for supplying a chemical solution and to a substrate treatment apparatus incorporating this system for performing a particular treatment on a substrate using the solution. The invention also relates to a coating and developing system incorporating the substrate treatment apparatus.

BACKGROUND OF THE INVENTION

Photolithography is a fundamental process for the fabrication of semiconductor devices or flat panel displays (FPD). Materials used during the process, however, could cause various defects. For instance, unwanted microparticles may be present in solutions such as a resist solution and an organic solvent. A solution containing dispersive polymers, in particular, is subject to local solidification (or gelation) of those substances with the passage of time, resulting in defects. To reduce the chances of defects, a solution is thus supplied to the dispenser nozzle of a spin coater after the solution is filtered by a filter (see JP-A-62-204877 and JP-A-2008-305980).

To enhance the effect of the filtration by a filter used in a resist supply system, it may be desirable to reduce the speed at which a resist solution passes through the filter (i.e., reduce the filtration rate). However, this method requires a long time for the solution to be dispensed onto a wafer, reducing the throughput of the device. Alternatively, if a filter of a small pore size is used to enhance the effect of the filtration, the filtration rate may decrease, resulting in reduced throughput of the resist supply system. The latter method also limits the selection of usable filters.

Conversely, to increase the throughput of the resist supply system, resist suction and filtration may have to be completed in a short amount of time by using a filter having a relatively large filtration surface. However, this does not necessarily increase the filtration rate because the resist solution may not pass through the entire filtration surface of the filter, flowing only through a less-pressurized section. For the purpose of increasing throughput, it also seems feasible to use two chemical supply systems for a single resist coating device, but this method may not allow the same amount of resist solution to be dispensed all the time due to the structural differences of pumps or the like.

SUMMARY OF THE INVENTION

The present invention has been contrived to solve the above issues, and an object of the invention is thus to provide a chemical supply system capable of enhancing the effect of filtration without compromising throughput.

In a first aspect, the invention is a chemical supply system comprising: a first container and a second container for storing a solution; a first pipe for connecting the first container and the second container; a first pump, located on the first pipe, for directing the solution stored in the first container to the second container; a first filter, located in the first pipe, for filtering the solution flowing through the first pipe from the first container toward the second container; a second pipe for connecting the first container and the second container; and a second pump, located on the second pipe, for directing the solution stored in the second container to the first container.

In a second aspect, the invention is a substrate treatment apparatus for performing a particular treatment on a substrate using a solution, the apparatus comprising: a substrate holder for holding a substrate to be treated; a chemical supply system; and a disperser for dispensing a solution from the chemical supply system onto the substrate. The chemical supply system comprises: a first container and a second container for storing the solution; a first pipe for connecting the first container and the second container; a first pump, located on the first pipe, for directing the solution stored in the first container to the second container; a first filter, located in the first pipe, for filtering the solution flowing through the first pipe from the first container toward the second container; a second pipe for connecting the first container and the second container; and a second pump, located on the second pipe, for directing the solution stored in the second container to the first container.

In a third aspect, the invention is a coating and developing system for depositing a resist film on a substrate and developing the resist film after light exposure, the system comprising: a resist coating unit; a development unit; a first chemical supply system for supplying a resist solution to the resist coating unit; and a second chemical supply system for supplying a developing solution to the development unit. The resist coating unit includes: a rotatable holder for holding a substrate to be treated; and a dispenser for dispensing the resist solution onto the substrate held by the rotatable holder. The development unit includes: a rotatable holder for holding a substrate to be treated; and a dispenser for dispensing a developing solution onto the substrate held by the rotatable holder, the substrate having a resist film deposited by the resist coating unit and light-exposed. The first and second chemical supply systems each comprise: a first container and a second container for storing the solution; a first pipe for connecting the first container and the second container; a first pump, located on the first pipe, for directing the solution stored in the first container to the second container; a first filter, located in the first pipe, for filtering the solution flowing through the first pipe from the first container toward the second container; a second pipe for connecting the first container and the second container; and a second pump, located on the second pipe, for directing the solution stored in the second container to the first container.

In accordance with the invention, a chemical supply system is provided which enhances the effect of filtration without compromising throughput.

BRIEF DESCRIPTION OF THE DRAWINGS

FIG. 8A illustrates a chemical supply system according to Modification 1 of the invention while

DETAILED DESCRIPTION OF THE INVENTION

Figure 1:
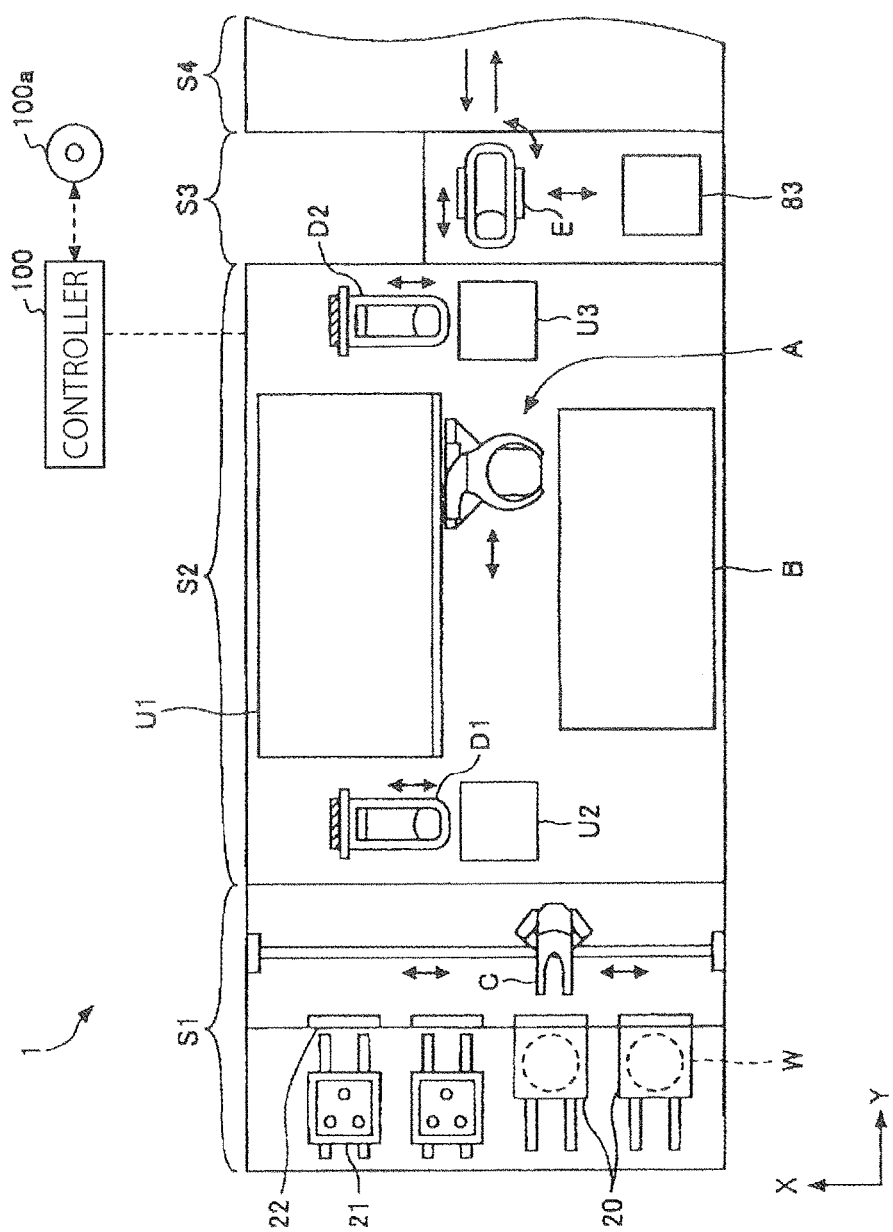
FIG. 1 is a plan view of a coating and developing system according to an embodiment of the invention.

A preferred embodiment of the present invention will now be described with reference to the accompanying drawings. Note that the same or similar components illustrated in the drawings are assigned the same or similar reference numerals and will not be described in a duplicate manner.

FIG. 1 is a plan view of a coating and developing system according to the preferred embodiment. As illustrated in FIG. 1, the coating and developing system 1 includes the following components: a carrier block S1 into/from which are transferred wafer carriers 20 each capable of housing several (e.g., thirteen) semiconductor wafers W; a treatment block S2 in which are installed multi-unit treatment boxes B and U1, shelf units U2 and U3, and a main arm A; and an interface block S3 located between the treatment block S2 and an exposure device S4.

The carrier block S1 includes the following components: a stage 21 on which to place multiple wafer carriers 20; doors 22 provided on a wall posterior to the stage 21; and a transfer arm C for transferring a wafer W from/into any of the wafer carriers 20 through one of the doors 22. The transfer arm C is designed to transfer the wafer W between the wafer carriers 20 and the later-described shelf unit U2 of the treatment block S2. The transfer arm C is capable of the following movements: vertical movement; rotation around a vertical axis; movement in the arrangement direction of the wafer carriers 20 (i.e., in the X direction); and extension or contraction relative to the wafer carriers 20 (in the Y direction).

The treatment block S2 is connected to the back surface of the carrier block S1 (i.e., to the surface of the treatment block S2 opposite the wall on which the doors 22 are located). The treatment block S2 includes the following components: the multi-unit treatment box B comprising several treatment units; the shelf unit U2 arranged closer to the carrier block S1; the shelf unit U3 arranged closer to the interface block S3; the main arm A movable between the shelf unit U2 and the shelf unit U3; and the multi-unit treatment box U1 that also comprises several treatment units as in the multi-unit treatment box B.

Figure 2:
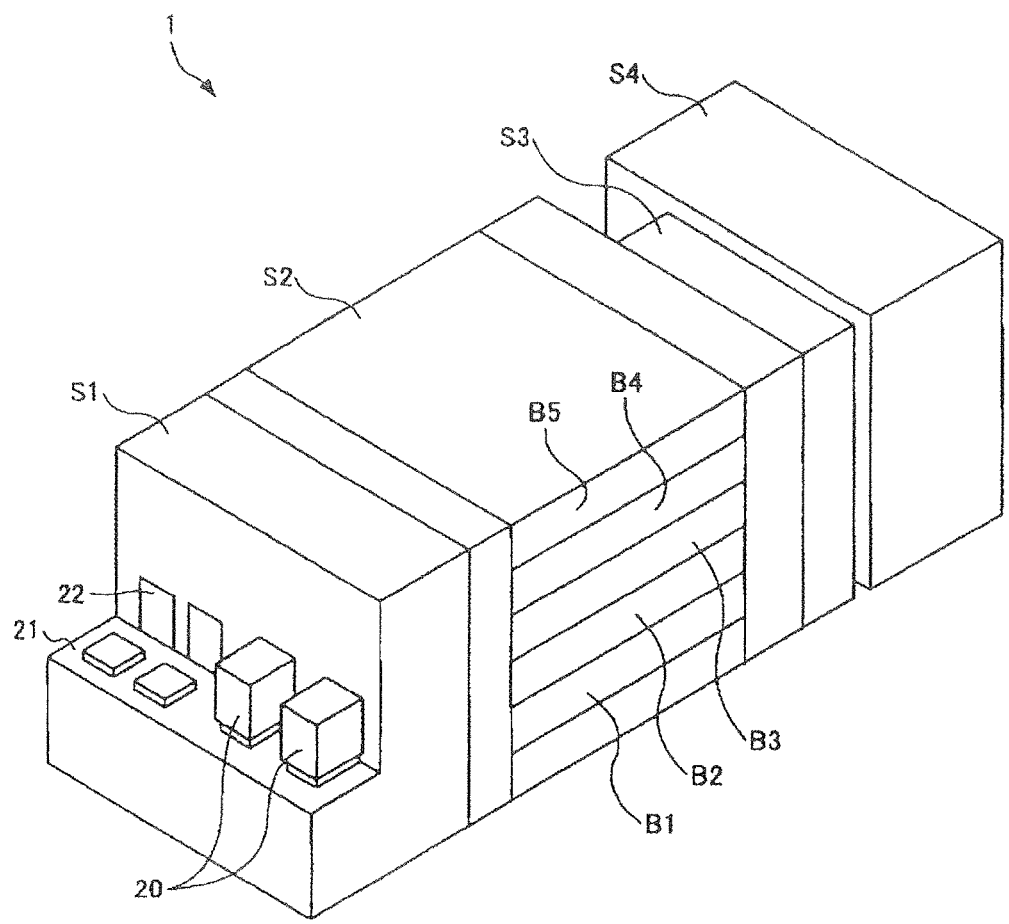
FIG. 2 is a perspective view of the system of FIG. 1.

As illustrated in FIG. 2, the multi-unit treatment box B comprises five unit blocks B1 to B5 stacked on each other. Each of the unit blocks B1 to B5 may include a resist coating unit, a development unit, a heating unit, a hydrophobizing unit, and/or a cooling unit. For instance, the unit blocks B1 and B2 may include the following treatment units: a post-exposure heating unit for heating a wafer W after the resist film on it was exposed to light; a cooling unit for adjusting the temperature of the wafer W heated by the post-exposure heating unit to a particular value; a development unit for developing the light-exposed resist film; and/or a baking unit for heating the wafer W after the development for drying purposes.

Figure 3:
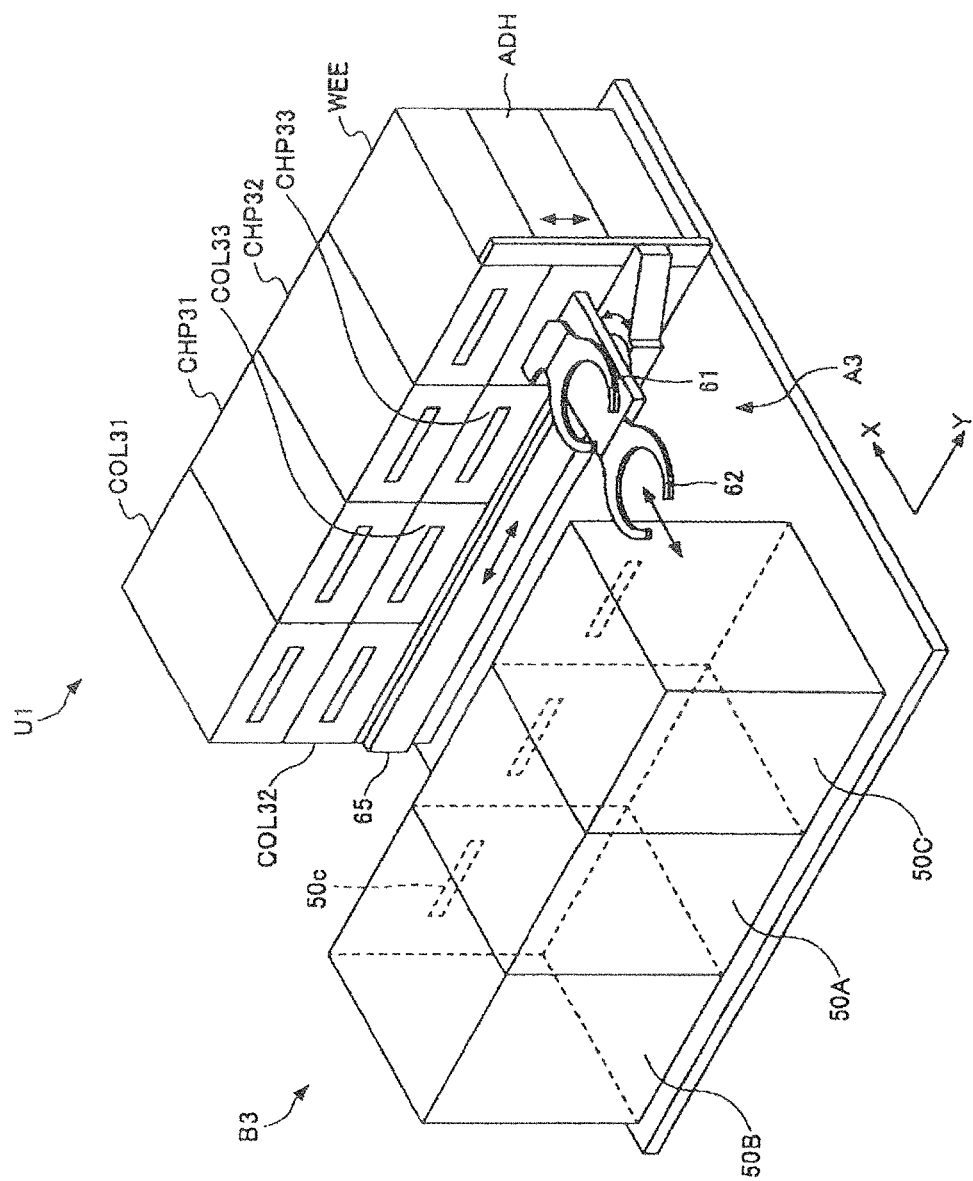
FIG. 3 is a perspective view of a treatment unit block within the system of FIG. 1.

The unit blocks B3 to B5, on the other hand, may include chemical coating units (later described in detail). The example of FIG. 3 shows the unit block B3 having three chemical coating units 50 (50A to 50C). In each of the chemical coating units 50, a solution of photoresist is dispensed onto a wafer W, and the wafer W is then spun to form a resist film on it. It is also possible for the chemical coating units 50 to coat a wafer W with an anti-reflective film by dispensing an anti-reflective solution onto the wafer W and then rotating the wafer W.

As illustrated in FIG. 3, the multi-unit treatment box U1 is installed right across from the unit block B3 with the motion space of a transfer arm A3 (described later) located between. As illustrated in FIG. 3, the multi-unit treatment box U1 of the present embodiment includes the following treatment units: cooling units COL31 to 33; heating units CHP31 to 33; a hydrophobizing unit ADH; an edge exposure unit WEE; and the like.

Thus, before the anti-reflective film coating unit 50B of the unit block B3 forms an anti-reflective film, one of the cooling units COL31 to 33 (e.g., COL31) can adjust the temperature of a wafer W to a particular value. In addition, the heating unit CHP31 can heat a wafer W coated with an anti-reflective film. It is also possible for the hydrophobizing unit ADH to hydrophobize a wafer W before the coating of a resist solution onto the wafer W, so that the contact between the resist solution and the wafer W can be enhanced. Furthermore, before a wafer W coated with a resist film is transferred to the exposure device S4, the edge exposure unit WEE may perform selective light exposure on only the edge of the wafer W.

As illustrated in FIG. 3, wafer transfer among the treatment units of the treatment box U1 and the chemical coating units 50 of the unit block B3 is done by the transfer arm A3, which is arranged to face the unit block B3. The transfer arm A3 has two forks 61 and 62 each for holding a wafer W and is movable along a rail 65 that extends in the Y direction. The transfer arm A3 is one of the components constituting the main arm A (see FIG. 1), and the main arm A further includes transfer arms A1, A2, A4, and A5 (see FIG. 4) for the unit blocks B1, B2, B4, and B5, respectively. Similar to the transfer arm A3, each of the transfer arms A1, A2, A4, and A5 also includes two forks and is movable in the Y direction. Note that reference numeral 50c of FIG. 3 denotes a slit through which the forks 61 and 62 of the transfer arm A3 move.

Note also that multi-unit treatment boxes structurally similar to the treatment box U1 can also be provided for the unit blocks B4 and B5.

Figure 4:
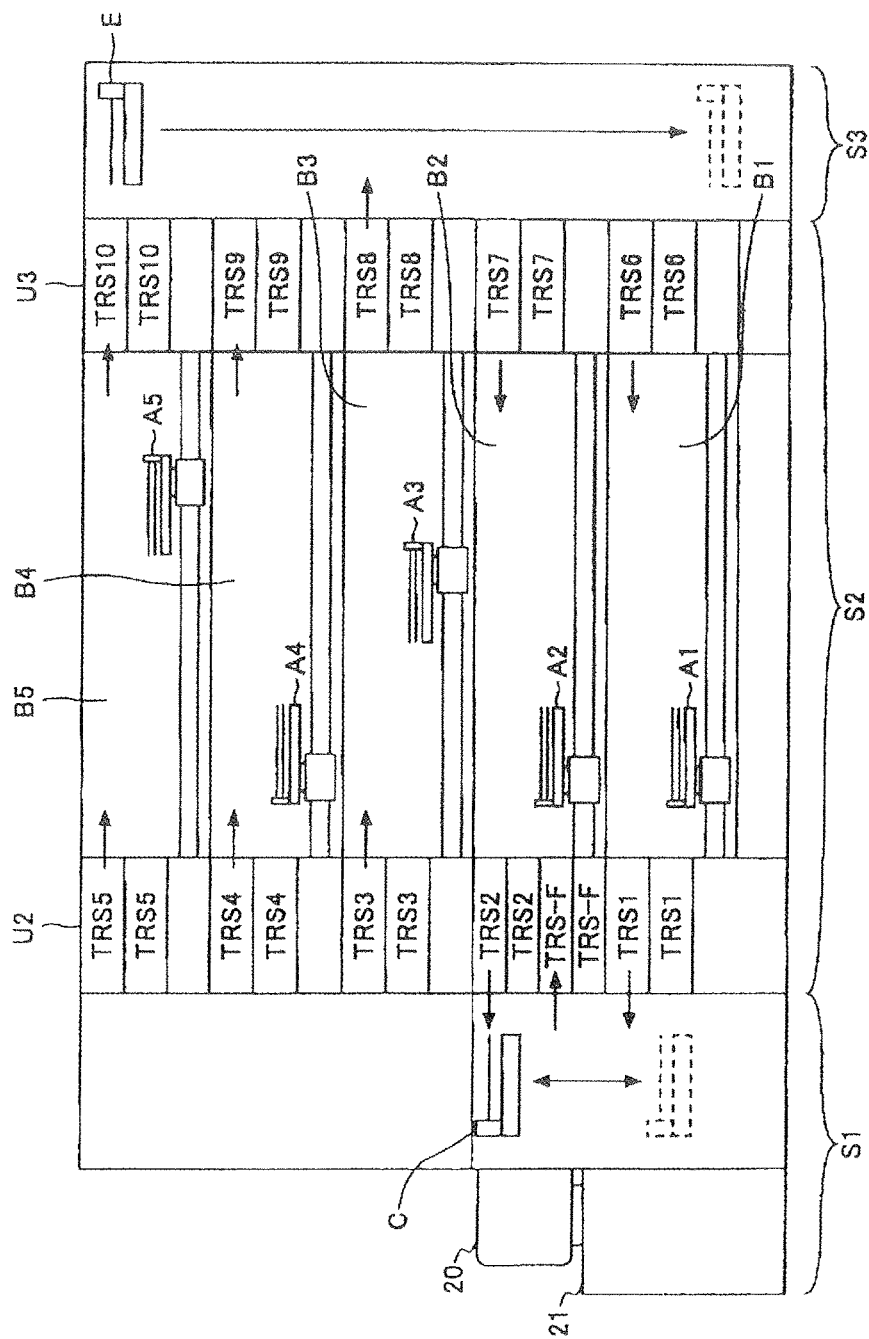
FIG. 4 is a side view of the system of FIG. 1.

Referring now to FIG. 4, the shelf unit U2 includes stages TRS1 to TRS5 for the unit blocks B1 to B5. In the example of FIG. 4, a pair of stages TRS1 is provided for the unit block B1. Each of the stages TRS1 is accessible by the transfer arm A1 provided for the unit block B1. By the transfer arm A1 moving a wafer W onto one of the stages TRS1, that stage can hold the wafer W. Specifically, after a wafer W has been subjected to a particular treatment at one of the treatment units of the unit block B1, the transfer arm A1 transfers the wafer W from that treatment unit onto one of the stages TRS1. The wafer W held by that stage TRS1 is then transferred by the transfer arm C of the carrier block S1 into one of the wafer carriers 20.

See FIG. 1 again to note that a transfer arm D1 is installed adjacent to the shelf unit U2. The transfer arm D1 is capable of moving back and forth as well as vertically. Thus, the transfer arm D1 can transfer the wafer W among the stages TRS1 to TRS5 of the shelf unit U2.

The shelf unit U2 also includes a pair of stages TRS-F. Each of the stages TRS-F is used primarily for the temporal storage of a wafer W that has been unloaded from a wafer carrier 20 by the transfer arm C of the carrier block S1.

The shelf unit U3 includes stages TRS6 to TRS10 for the unit blocks B1 to B5. For example, in the shelf unit U3, a pair of stages TRS10 is provided for the unit block B5. Each of the stages TRS10 is accessible by the transfer arm A5 provided for the unit block B5. By the transfer arm A5 moving a wafer W onto one of the stages TRS10, that stage can hold the wafer W. Specifically, after a wafer W has been subjected to a particular treatment at one of the treatment units of the unit block B5, the transfer arm A5 transfers the wafer W from that treatment unit onto one of the stages TRS10, and that stage holds the wafer W. The wafer W held by that stage TRS10 is then transferred by the interface arm E (described later) of the interface block S3 into the exposure device S4 (see FIG. 1).

See FIG. 1 to note that a transfer arm D2 is installed adjacent to the shelf unit U3. The transfer arm D2 is capable of moving back and forth as well as vertically. Thus, the transfer arm D2 can perform wafer transfer among the stages TRS5 to TRS10 of the shelf unit U3.

As illustrated in FIG. 1, the interface block S3 is connected to the treatment block S2 such that the treatment block S2 is sandwiched by the carrier block S1 and the interface block S3. The interface block S3 includes the following components: the above-mentioned interface arm E for transferring a wafer W between the shelf unit U3 of the treatment block S2 and the exposure device S4; and a buffer unit 83 having multiple stages each capable of holding several wafers W. The interface arm E serves as a wafer transfer mechanism for transferring wafers W between the treatment block S2 and the exposure device S4. In the present embodiment, the interface arm E is capable of moving vertically, pivoting around a vertical axis, and moving back and forth in the X direction. Accordingly, the interface arm E can transfer the wafer W between the stages TRS6 to TRS10 of the shelf unit U3 provided for the unit blocks B1 to B5 and the stages of the buffer unit 83.

The buffer unit 83 can be used for adjusting the throughput between the exposure device S4 and the treatment block S2 or for temporarily storing wafers W coated with a resist film or the like at the time of changing exposure conditions, so that the wafers W can be put on standby for later transfer to the exposure device S4. Thus, the buffer unit 83 allows adjustment of the treatment speed of the treatment block S2 according to the treatment speed of the exposure device S4. This in turn allows exposure intensity or reticules to be changed for each wafer lot during the process of exposure.

Figure 5A:
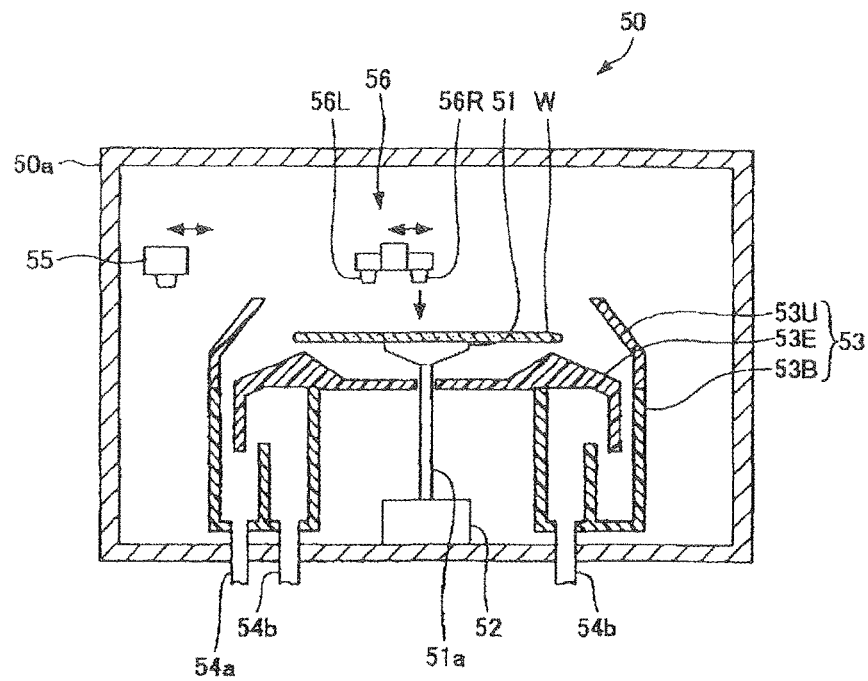
FIGS. 5A and 5B illustrate a coating unit used in the coating and developing system according to the embodiment of the invention.

A coating unit 50 may be installed at, for example, the unit block B3 of the multi-unit treatment box B. As illustrated in FIG. 5A, the coating unit 50 includes the following components: a chuck 51 for holding the bottom center portion of a wafer W by vacuum suction; and a motor 52 for rotating the chuck 51 via a rotary shaft 51a connected to the chuck 51. The coating unit 50 further includes a dispenser 56 for dispensing a chemical solution (e.g., a resist solution) onto the wafer W held by the chuck 51 and a concave-shaped cup section 53 that surrounds the wafer W held by the chuck 51.

The cup section 53 comprises an upper cup 53U, a bottom cup 53B, and a cup base 53E. The upper cup 53U is located on a top section of the bottom cup 53B so that while the dispenser 56 is dispensing a solution onto the wafer W, the upper cup 53U can receive the part of the solution scattered by the rotation of the wafer W. A waste pipe 54a is connected to the bottom of the bottom cup 53B so that the solution that has flowed down to the bottom cup 53B can be discharged out of the cup section 53 through the waste pipe 54a. Multiple exhaust pipes 54b are also connected to the bottom of the bottom cup 53B. The exhaust pipes 54b are connected to an exhaust section not illustrated. This exhaust section may be the exhaust treatment equipment installed in a clean room in which the resist coating and developing system 1 is to be installed. The exhaust pipes 54b allow the air within the cup section 53 to be exhausted. Therefore, organic solvents evaporating from the solution (e.g., resist solution) dispensed onto the wafer W can be exhausted as well. The exhaust ventilation by the exhaust pipes 54b reduces cross-contamination resulting from such organic solvents within the resist coating and developing system 1.

Figure 5B:
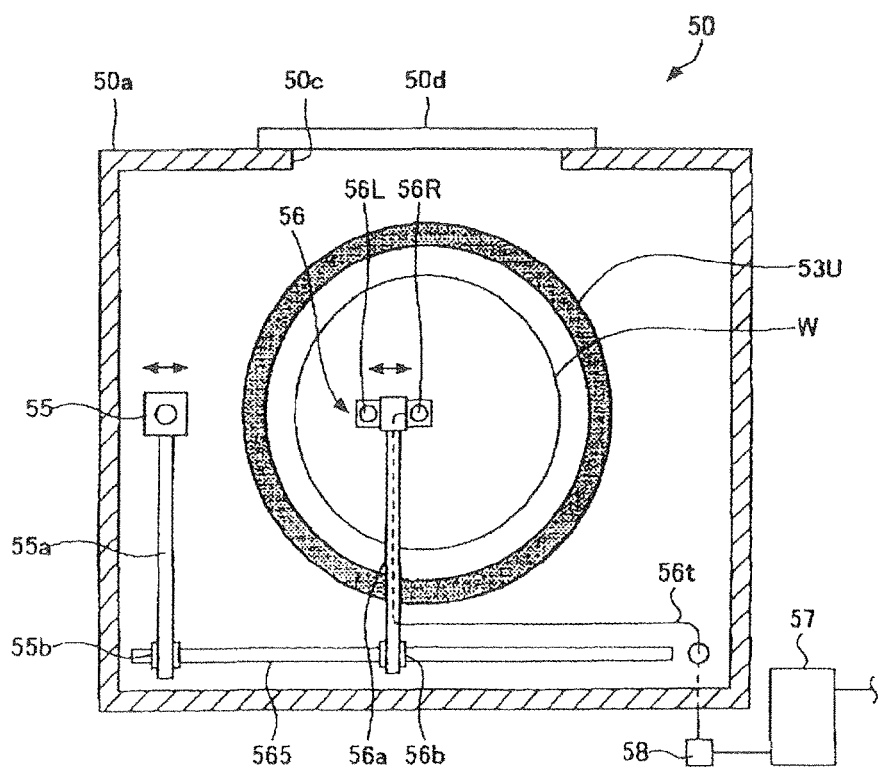

As illustrated in FIG. 5B, the dispenser 56 includes the following components: an arm 56a attached to a guide rail 565 via a base section 56b; and a resist nozzle 56R and a solvent nozzle 56L both attached to the distal end of the arm 56a. The base section 56b can slide along the guide rail 565 by a drive mechanism not illustrated. Thus, the arm 56a can be positioned above the wafer W or outside of the upper cup 53U.

One end of a tube 56t is connected to the resist nozzle 56R, and the other end of the tube 56t is connected via an on-off valve 58 to a chemical supply system 57 of the present embodiment, which is located outside of the coating unit 50. The tube 56t is flexible enough so as not to interfere with the motion of the dispenser 56; thus, the tube 56t can be formed of plastic or the like. To supply a resist solution from the chemical supply system 57 onto the wafer W, the arm 56a first slides along the guide rail 565 to position the resist nozzle 56R above the approximate center portion of the wafer W, and the on-off valve 58 is then opened.

The solvent nozzle 56L is used to wet the surface of the wafer W with a solvent (pre-wetting) before the dispensation of a resist solution by the resist nozzle 56R. Although not illustrated, the solvent nozzle 56L is connected to the chemical supply system of the present embodiment by a tube and an on-off valve, as is similar to the resist nozzle 56R. This chemical supply system is designed to supply a solvent such as a thinner. To supply the thinner from the chemical supply system onto the wafer W, the arm 56a first slides along the guide rail 565 to position the solvent nozzle 56L above the approximate center portion of the wafer W, and the on-off valve is then opened. Thereafter, the wafer W is rotated at a given speed for a given amount of time, thereby wetting the surface of the wafer W with the solvent.

As illustrated in FIG. 5B, the coating unit 50 further includes an EBR (edge bead removal) dispenser 55 for supplying rinse liquid onto the edge of the wafer W in order to remove the resist film deposited on the edge of the wafer W during resist coating. The EBR dispenser 55 is attached to the base section 55b that is slidably attached to the guide rail 565.

Although not illustrated, the EBR dispenser 55 is connected to the chemical supply system of the present embodiment by a tube and an on-off valve. This chemical supply system is designed to supply rinse liquid. After a resist film is deposited on the wafer W held by the chuck 51, the arm 55a of the EBR dispenser 55 moves along the guide rail 565 while the wafer W is being rotated. When the EBR dispenser 55 is positioned above the edge of the wafer W and the on-off valve is opened, the chemical supply system starts to supply the rinse liquid onto the edge to remove the resist film deposited on the edge.

It should be noted that development units to be installed in the treatment block S2 of the coating and developing system 1 can be structurally the same as the coating unit 50, except that a developing solution needs to be dispensed from the resist nozzle 56R or the solvent nozzle 56L of the dispenser 56. In such development units, the chuck 51 holds a wafer W that has been resist-coated by the coating unit 50 and light-exposed by the exposure device. The developing solution is dispensed onto this wafer from the dispenser 56 to develop the light-exposed resist film.

Figure 6:
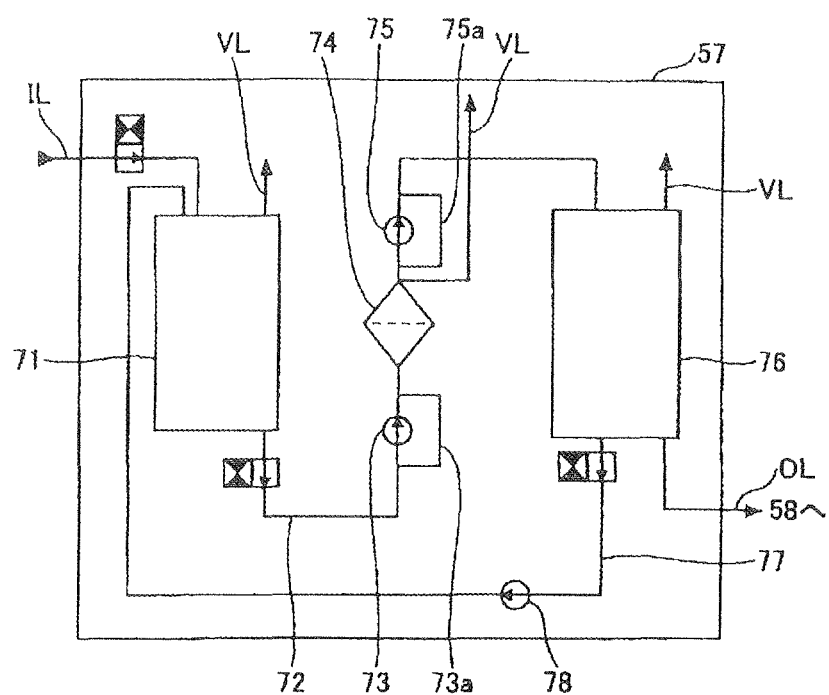
FIG. 6 illustrates a chemical supply system according to an embodiment of the invention.

Next described with reference to FIG. 6 is the chemical supply system 57 of the present embodiment. As illustrated in FIG. 6, the chemical supply system 57 includes an inlet tank 71, a first pump 73, a filter 74, a second pump 75, an outlet tank 76, a return pipe 77, and a return pump 78.

The inlet tank 71 is connected via a pipe IL to a resist bottle not illustrated; the inlet tank 71 is designed to store the resist solution supplied from the resist bottle via the pipe IL. One end of a pipe 72 is also connected to the inlet tank 71 while the other end of the pipe 72 is connected to the outlet tank 76.

The components installed along the pipe 72 are, from the inlet tank 71 to the outlet tank 76, the first pump 73, the filter 74, and the second pump 75 in the stated order. The resist solution stored by the inlet tank 71 is directed to the filter 74 by the first pump 73. The resist solution filtered by the filter 74 is then suctioned by the second pump 75 and directed to the outlet tank 76. Thus, the outlet tank 76 stores the resist solution filtered and cleaned by the filter 74.

One end of an outlet pipe OL is connected to the outlet tank 76 while the other end of the outlet pipe OL is connected to the on-off valve 58 provided for the already-described coating unit 50 (see FIG. 5B). Thus, part of the clean resist solution stored by the outlet tank 76 is supplied to the coating unit 50 through the outlet pipe OL. One end of the return pipe 77 is also connected to the outlet tank 76 while the outer end of the return pipe 77 is connected to the inlet tank 71. Accordingly, the inlet tank 71 and the outlet tank 76 communicate with each other via the return pipe 77. The return pump 78 is located on the return pipe 77; the return pump 78 is designed to return part of the clean resist solution stored by the outlet tank 76 to the inlet tank 71.

A bypass pipe 73a is provided to bypass the first pump 73. When the stop valve (not illustrated) in the bypass pipe 73a is opened, the resist solution flowing from the inlet tank 71 passes through the bypass pipe 73a to the filter 74. Depending on the resist solution or the filter F used, it is possible for the second pump 75 alone to let the resist solution pass through the filter 74 without applying excessive stress to the solution. In such case, it is preferred that the bypass pipe 73a be used without using the first pump 73. In that case, it is instead possible to connect the inlet tank 71 to the filter 74 by the pipe 72 alone (i.e., without the first pump 73 and the bypass 73a).

Likewise, a bypass pipe 75a is provided to bypass the second pump 75. The use of the second pump 75 can be selected by controlling the stop valve (not illustrated) in the bypass pipe 75a. The use of the bypass pipe 75a (i.e., non-use of the second pump 75) is preferred when the first pump 73 alone can supply the resist solution to the outlet tank 76 without the aid of the second pump 75 which suctions the resist solution from the filter 74. In that case, it is instead possible to connect the filter 74 and the outlet tank 76 by the pipe 72 alone (i.e., without the second pump 75 and the bypass pipe 75a).

It should be noted that vent lines VL are provided for the inlet tank 71, the filter 74, and the outlet tank 76 (associated vent valves are not illustrated), so that air bubbles in the resist solution can be removed. The vent lines VL are to be connected to the ventilation equipment installed in a clean room, which removes any harmful substances from the gas discharged from the vent lines VL before releasing it to the atmosphere.

Next described is how the chemical supply system 57 of the present embodiment supplies the resist solution to the already-described coating unit. Suctioned by the first pump 73 and the second pump 75, a given amount of the resist solution is directed from the inlet tank 71 to the filter 74, where the solution is filtered. The filtered resist solution is stored in the outlet tank 76. The resist nozzle 56R of the dispenser 56 is then positioned above the approximate center portion of a wafer W located within the coating unit 50, and the on-off valve 58 of the coating unit 50 is opened. Thereafter, the resist solution stored in the outlet tank 76 is supplied to the dispenser 56 via the outlet pipe OL. As a result, the solution is dispensed from the resist nozzle 56R onto the wafer W.

In the meantime, the return pump 78 returns part of the resist solution stored in the outlet tank 76 to the inlet tank 71 through the return pipe 77. Mixed with the resist solution supplied from the resist bottle, the resist solution returned to the inlet tank 71 is temporarily stored in the inlet tank 71; the mixed resist solution can later be fed to the outlet tank 76 again through the first pump 73, the filter 74, and the second pump 75. In other words, the resist solution can circulate through the pipe 72 and the return pipe 77, passing through the inlet tank 71, the first pump 73, the filter 74, the second pump 75, the outlet pump 76, and the return pump 78 and back to the inlet tank 71. During the circulation, the resist solution can be filtered each time it passes through the filter 74. Such circulation is performed independently of the supply of the resist solution stored in the outlet tank 76 to the coating unit 50.

As stated above, a particular amount of filtered resist solution is stored in the outlet tank 76, and a particular amount of the resist solution stored in the outlet tank 76 is supplied to the chemical supply unit 50. Accordingly, the suction of the same amount of resist resolution into the outlet tank 76 as the amount discharged onto the wafer W need not be performed at the same time as the timing of the discharge (that is, even if the resist solution in the outlet tank 76 has decreased in amount by the discharge onto the wafer, the outlet tank 76 still has a sufficient amount to be used for the next discharge).

Therefore, resist discharge onto the wafer W, resist suction into the outlet tank 76, filtration by the filter 74 can be performed independently. Consequently, it is possible to perform the above-described resist circulation at a relatively low speed (i.e., reduce the rate of the filtration) to enhance the filtration effect. At the same time, it is also possible to increase the rate of the resist discharge to increase throughput.

Figure 7:
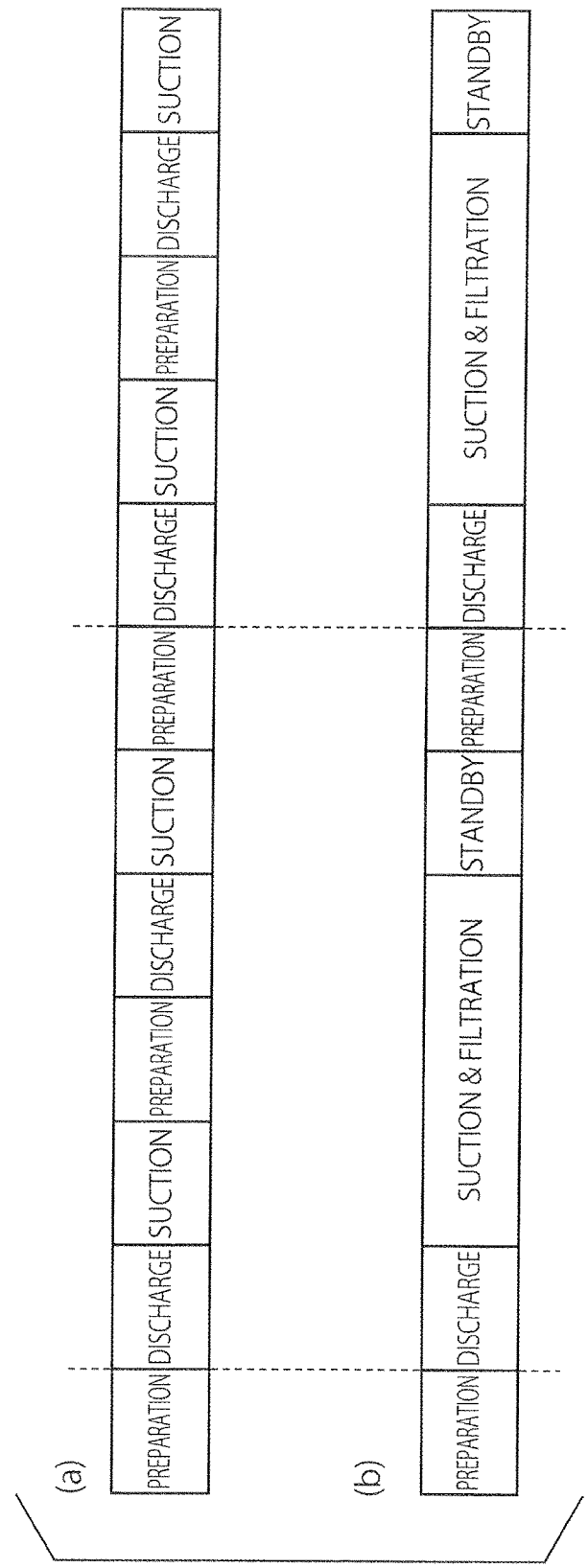
FIG. 7 shows timing charts illustrating the operation of the chemical supply system of FIG. 6 and the operation of another chemical supply system according to a comparative example (FIG. 9)
Figure 9:
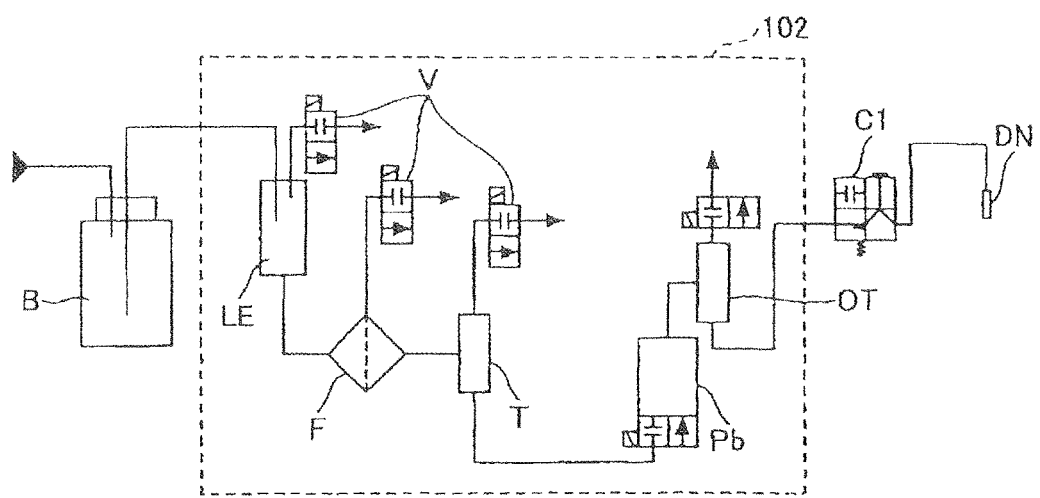
FIG. 9 illustrates a chemical supply system according to a comparative example.

FIG. 7 illustrates the above operation of the chemical supply system 57 as contrasted with the operation of a chemical supply system 102 (see FIG. 9). As illustrated in FIG. 7(a), in the chemical supply system 57 of the present embodiment, a given amount of resist solution is supplied from the outlet tank 76 to a coating unit 50 during a given period of time, and that solution is discharged from the dispenser 56 onto a wafer W. After this discharge operation, the same amount of resist solution as the amount discharged is replenished (suction operation). During this suction operation, that amount of resist solution may be suctioned into the inlet tank 71 from a resist bottle (not illustrated) instead of being suctioned into the outlet tank 76 since the outlet tank 76 has an extra amount of resist solution left. The suction operation is completed in a short amount of time because no filter is provided in the pipe IL that connects the resist bottle and the inlet tank 71. Resist transfer from the inlet tank 71 to the outlet tank 76 and/or resist circulation between the inlet tank 71 and the outlet tank 76 are/is performed concurrently with the discharge and suction operations. During such resist transfer and circulation, the resist solution is filtered each time it passes through the filter 74. Accordingly, the cycle of resist supply from the chemical supply system 57 to the coating unit 50 only needs to have a discharge operation and a short-time suction operation and can be repeated at short time intervals. Thus, the supply of the resist solution can be performed in synchronization with a cycle that includes, for example, the transfer of a wafer into the coating unit 50, pre-wetting of the wafer surface, resist coating, wafer rotation, EBR (edge bead removal) process, and the transfer of the wafer out of the chemical coating unit 50.

FIG. 9 illustrates a chemical supply system according to a comparative example. The chemical supply system 102 of FIG. 9 includes a liquid end tank LE, a filter F, a trap T, a pump Pb, and a trap OT. The trap T is located between the filter F and the pump Pb so that the trap T can remove relatively large air bubbles which cannot be removed by a vent valve V provided for the filter F. Likewise, the trap OT, located downstream of the pump Pb, is used to remove the air remaining within the pump Pb.

In this system 102, a given amount of resist solution is first supplied from a resist bottle B to the liquid end tank LE for storage. When the on-off valve C1 located between the chemical supply system 102 and the dispenser nozzle DN of a resist coating unit is opened, the pump Pb of the chemical supply system 102 pressurizes the resist solution, thereby dispensing the solution through the dispenser nozzle DN onto a wafer located within the resist coating unit. At the same time, the pump Pb suctions from the liquid end tank LE the same amount of resist solution as the amount dispensed onto the wafer. During the suction, the resist solution passes through the filter F, whereby impurities in the solution are removed.

As also illustrated in FIG. 7(*b*), the chemical supply system 102 of FIG. 9 first performs a discharge operation in which a given amount of resist solution is discharged from the dispenser nozzle DN onto a wafer during a given period of time. After the discharge operation (or at the same time as the discharge operation), the same amount of resist solution as the amount discharged is suctioned from the liquid end tank LE. This suction, however, requires a long time for the resist solution to pass through the filter F since the filter F is located between the liquid end tank LE and the pump Pb. Thus, as illustrated in FIG. 7(*b*), the total amount of time required for the suction and the filtration is longer than the time required for the discharge operation. This makes it difficult to synchronize the cycle performed by the chemical supply system 102 with the cycle performed by, for example, a coating unit 50, and the synchronization may require a waiting period. As illustrated in FIGS. 7(*a*) and 7(*b*), the chemical supply system 102 of FIG. 9 performs only one discharge operation during the time period during which the chemical supply system 57 of the present embodiment performs two discharge operations. From the above explanation, the advantages of the chemical supply system 57 are obvious.

As stated above, the chemical supply system 57 allows for the circulation of resist solution between the inlet tank 71 and the outlet tank 76. Thus, the resist solution filtered by the filter 74 will not stay within the outlet tank 76 for a long period of time. When the resist solution, even if filtered, stays within the outlet tank 76 for a long time, it deteriorates within the tank 76 with its photo-resistive substances turning into polymers, which results in wafer defects. The present embodiment prevents such wafer defects since it allows the resist solution to be circulated and remain cleaned. In addition, since the resist solution does not remain attached to the filter 74 for a long time due to the circulation of the solution, the filter 74 is prevented from being clogged. This extends the life of the filter 74 and reduces the frequency of filter maintenance, which in turn results in increased throughput due to shortened downtime of the chemical supply system 57.

Moreover, since the chemical supply system 57 of the present embodiment allows for the independent control of resist suction, filtration, and discharge, it is possible to independently set the filtration rate, the amount of resist solution to be returned from the outlet tank 76 to the inlet tank 71, the discharge amount, and so forth. Accordingly, each coating unit 50 of the present embodiment can perform treatments in a flexible manner.

Figure 8A:
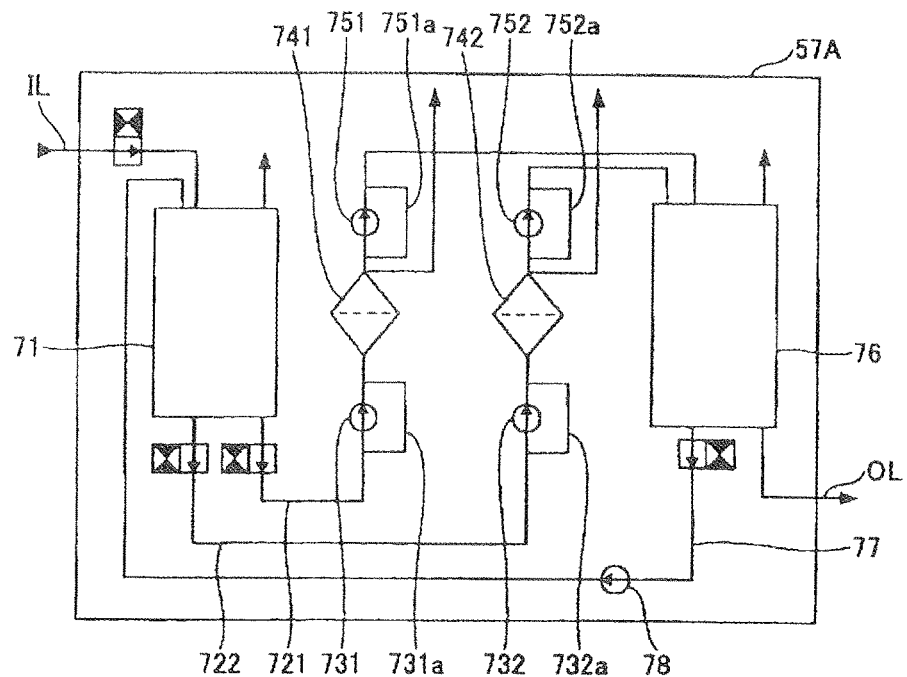
Figure 8B:
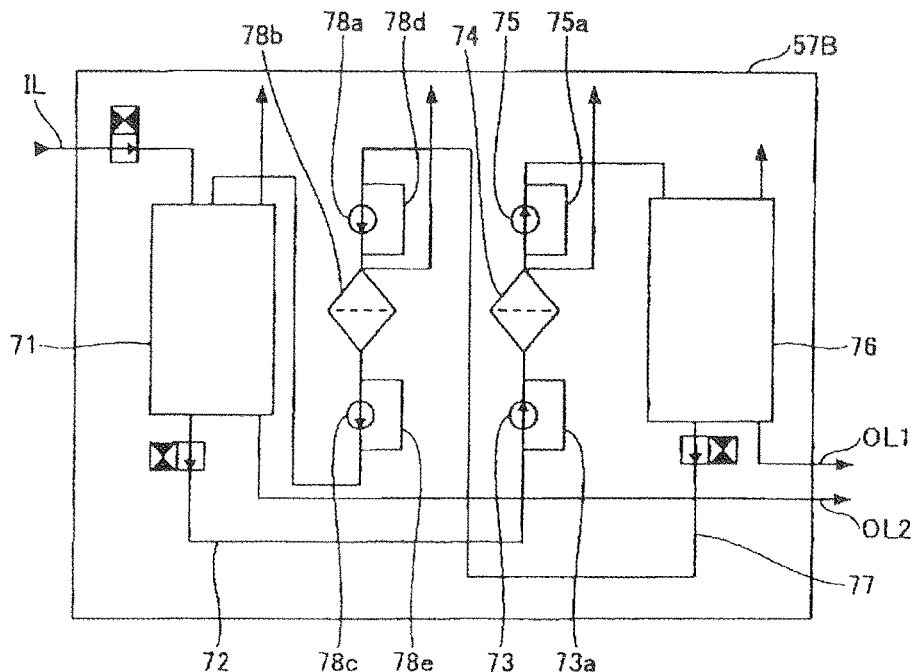
FIG. 8B illustrates a chemical supply system according to Modification 2 of the invention.

Described next with reference to FIGS. 8A and 8B are modifications of the chemical supply system 57 of the present embodiment.

Modification 1

FIG. 8A illustrates a chemical supply system 57A according to Modification 1. In this chemical supply system 57A, two pipes 721 and 722 are located between the inlet tank 71 and the outlet tank 76. The components installed on the pipe 721 are a first pump 731, a filter 741, and a second pump 751 while the components installed on the pipe 722 include a first pump 732, a filter 742, and a second pump 752. Bypass pipes 731*a* and 732*a* are provided to bypass the first pumps 731 and 732 while bypass pipes 751*a* and 752*a* are provided to bypass the second pumps 751 and 752.

In this system 57A, resist transfer from the inlet tank 71 to the outlet tank 76 and resist filtration between the two are performed through the two pipes 721 and 722. Further, the chemical supply system 57A also includes the return pipe 77 and the return pump 78 so that the resist solution can be circulated between the inlet tank 71 and the outlet tank 76. Thus, the chemical supply system 57A of Modification 1 has the same advantages as those of the chemical supply system 57 of FIG. 6. It should be noted that the two pipes 721 and 722 of the system 57A need not be used all the time. It is instead possible to use only one of the pipes 721 and 722 by installing stop valves upstream of the first pumps 731 and 732 and downstream of the second pumps 751 and 752. This is particularly useful when, for example, the filter 742 of the pipe 722 needs to be replaced during the use of pipe 721.

Modification 2

FIG. 8B illustrates a chemical supply system 57B according to Modification 2 of the present embodiment. In this system 57B, a first pump 78*a*, a filter 78*b*, and a second pump 78*c* are installed along the return pipe 77 that connects the inlet tank 71 and the outlet tank 76. Accordingly, the resist solution stored in the outlet tank 76 is also filtered by the filter 78b when the solution is returned to the inlet tank 71 by the first pump 78a and the second pump 78c. This means that the resist solution is filtered twice during one circulation of the solution (i.e., from the inlet tank 71 to the outlet tank 76 and back to the inlet tank 71). Therefore, the chemical supply system 57B not only has the same advantages as those of the chemical supply system 57 of FIG. 6, but also enhances the effect of filtration. Further, in the system of 57B as well, a bypass pipe 78d and a bypass pipe 78e are provided for the first pump 78a and the second pump 78c, respectively.

While an outlet pipe OL1 is connected to the outlet tank 76 of the system 57B to supply the resist solution to a coating unit 50, an outlet pipe OL2 can also be connected to the inlet tank 71. In that case, after a given amount of resist solution is supplied from a resist bottle not illustrated to the inlet tank 71, that solution circulates between the inlet tank 71 and the outlet tank 76 for a given amount of time. By doing so, the resist solution stored in the inlet tank 71 also remains clean due to filtration. Because of the enhanced filtration effect by the two filters 74 and 78b, the resist solution stored in the inlet tank 71 can be cleaned in a relatively short amount of time. Accordingly, the cleaned resist solution can be supplied from the inlet tank 71 through the outlet pipe OL2 to the coating unit 50.

It is to be noted that the return pipe 77 of the system 57A of FIG. 8A can be provided with the first pump 78a, the filter 78b, and the second pump 78c of FIG. 8B, in place of the return pump 78 of the system 57A of FIG. 8A. In that case, the outlet pipe OL2 of FIG. 8B can also be connected to the inlet tank 71 of the system 57A.

While we have described one preferred embodiment of the present invention and two modifications, the invention is not limited thereto but can be modified within the scope of the appended claims.

For instance, while we have stated that the above-described chemical supply system 57 supplies a resist solution to any coating unit 50, the chemical supply system 57 can also supply an anti-reflective solution instead of the resist solution.

The chemical supply system 57 can also be used to supply a developing solution to any development unit that develops light-exposed resist films. Furthermore, the chemical supply system 57 can also supply solutions that are used to form on wafers SOD (spin-on dielectric) films such as polyimide films and low-k dielectric films.

When the chemical supply system of the present embodiment is to be used to supply a developing solution or rinse liquid, either may be supplied to the inlet tank 71 not from a canister tank storing developer or rinse liquid but from the chemical supply equipment shared in a clean room.

Especially when rinse liquid is to be supplied, a single chemical supply system 57 can be used to supply the rinse liquid to multiple coating units and/or multiple development units. In units including multiple dispenser nozzles (e.g., an EBR dispenser and a back rinse nozzle), the single supply system 57 can supply the rinse liquid to the multiple nozzles. Such supply of a chemical solution from a single chemical supply system 57 to multiple units or multiple dispensers is preferred in that the uniformity of wafer thicknesses and device characteristics can be increased by using chemical solutions of the same lot for wafers of the same lot. Such chemical supply by a single chemical supply system 57 is also preferred when the system 57 needs to supply a deterioration-prone solution that needs to be used up in a short time.

Moreover, any of the pipes 72, 721, and 722 and the return pipe 77 can be provided with a throttle valve having an orifice smaller than the inner diameters of those pipes. Such a throttle valve is capable of not only controlling the flow rate of the chemical solution flowing through the pipes but also applying a given pressure to the solution. High pressure is applied to the solution at the entrance of the throttle valve, and the solution is released from the pressure when it passes through the orifice of the throttle valve. After the solution is released from the pressure, gas dissolved in the solution is increasingly separated from the solution with the pressure decrease. Accordingly, such dissolved gas can be removed with ease, which in turn reduces wafer defects resulting from such dissolved gas.

In the chemical supply system 57 (see FIG. 6), for example, it is possible to install a throttle valve upstream of the filter 74 or replace the first pump 73 with a throttle valve. Likewise, it is also possible to install a throttle valve downstream of the filter 74 or replace the second pump 75 with a throttle valve. It is further possible to install a throttle valve upstream or downstream of the return pump 78. When the first pump 73 is to be replaced with a throttle valve, the valve can adjust the pressure exerted on the entrance side of the filter 74, meaning the effect of the filtration by the filter 74 can be controlled or kept unchanged. When, on the other hand, the second pump 75 is to be replaced with a throttle valve, the valve can adjust the pressure exerted on the exit side of the filter 74, meaning that the effect of the filtration by the filter 74 can be controlled or kept unchanged. Further, by installing a throttle valve upstream of the return pump 78, the solution can be depressurized before the return pump 78, resulting in active separation of dissolved gas from the solution. Such separated gas can be discharged through the vent valve (not illustrated) in the return pump 78. Moreover, when a throttle valve is to be installed downstream of the return pump 78, the solution can be depressurized before the inlet tank 71, resulting in active separation of dissolved gas from the solution. Such separated gas can be discharged through the vent line VL of the inlet tank 71. It should be noted that it is also possible to install a throttle valve in the pipe IL (see FIG. 6) that connects the inlet tank 71 to a resist bottle or a canister tank (not illustrated). This throttle valve can combined with a vent valve.

In the chemical supply system 57A (FIG. 8A) as well, it is possible to install a throttle valve upstream of the filter 741 (or the filter 742) or replace the first pump 731 (or the first pump 732) with a throttle valve. It is also possible to install a throttle valve downstream of the filter 741 (or the filter 742) or replace the second pump 751 (or the second pump 752) with a throttle valve. A throttle valve can further be installed upstream or downstream of the return pump 78.

In the chemical supply system 57B (FIG. 8B) as well, it is possible to install a throttle valve upstream of the filter 74 or replace the first pump 73 with a throttle valve. Likewise, it is also possible to install a throttle valve downstream of the filter 74 or replace the second pump 75 with a throttle valve. A throttle valve can further be installed upstream or downstream of the first pump 78a (see FIG. 8B) located on the return pipe 77 or installed upstream or downstream of the second pump 78c (see FIG. 8B) located on the return pipe 77.

The chemical supply system 57A of Modification 1 can use filters of different pore sizes for the filters 741 and 742. In the case of the chemical supply system 57B of Modification 2, the filter 74 in the pipe 72 may be one of a small pore size, and the filter 78b in the return pipe 77 may be one of a relatively large pore size. Conversely, it is also possible to make the pore size of the filter 78*b* in the return pipe 77 smaller than that of the filter 74.

As the first pumps (73, etc.) and the second pumps (75, etc.), it is possible to use air pumps, mechanical pumps, or flow-rate control pumps. When a resist solution or an anti-reflective solution is to be supplied, the use of air pumps is preferred. This is because an air pump allows the shear stress applied to a solution to be kept unchanged, thus capable of controlling fluctuations in the ratio of solvents in the solution as well as reducing the amount of dissolved gas. On the other hand, a flow-rate control pump prevents pressure from being applied abruptly to the filter 74 or the like if the amount of discharge from the pump is increased gradually after start-up. For instance, when the chemical supply system 57 and coating units 50 are restarted after idle status, the solution in the system 57 may flow abruptly toward the filter 74 and the like, applying a high pressure to such components. In that case, impurities in the solution may flow through the filter 74. Thus, it is preferred that the application of abrupt pressure to the filter 74 or the like is avoided by using a flow-rate control pump. In this case, it is more preferred that the flow-rate control pump is used as the first pump 73 or the like.

As a further modification, it is also possible to install pressure sensors upstream and downstream of the filter 74 or the like. By monitoring the differential pressure across the filter 74, the proper replacement timing of the filter 74 or the like can be known with ease.

The volumes of the inlet tank 71 and the outlet tank 76 can be determined according to the number of wafers to be treated (or the number of wafers in one lot). In place of, or in addition to, the above pressure sensors, another pressure sensor can be installed downstream of the first pump 73 or the like. This sensor allows for monitoring of the pressure applied to a solution so that dissolved gas in the solution can be reduced with ease. It is also possible to install a flowmeter in the pipe 72, 721, or 722 so that the flow rate of the chemical solution flowing through the pipe can be measured. In that case, clean chemical solution can be prepared based on the flow rate measured by the flowmeter (i.e., based on the amount of chemical solution used in a coating unit 50). Such a flowmeter can instead be installed in the return pipe 77.

Pressure sensors, flow meters, and flow-rate control pumps such as the ones described above can be used in combination so that the solution flow in any of the chemical supply systems 57, 57A, and 57B can be controlled more properly. This in turn allows the supply of a clean solution with little dissolved gas to any coating unit 50.

As still another modification, it is also possible to install multiple divergent pipes downstream of the first pump 73 of the chemical supply system 57 (see FIG. 6) so that the pipe 72 can diverge. Each of these divergent pipes can be provided with a filter 74. In that case, the divergent pipes need to communicate with the pipe 72 at an upstream position of the second pump 75. Each of the divergent pipes can also be provided with a stop valve so that the operator can determine which filter(s) should be used.

Each of the chemical supply systems described above can be used not only to supply a chemical solution to a coating unit or a development unit, but to supply rinse liquid to a wafer cleaning unit. The use of the chemical supply systems is not limited to semiconductor wafer treatment, but they can be used for the treatment of glass substrates for flat panel displays.

The invention claimed is:

1. A chemical supply method implemented by a chemical supply system to dispense a solution from a chemical supply source onto a substrate via a chemical dispense unit;
   wherein the chemical supply system comprises:
   a first container connected to the chemical supply source via an inlet pipe;
   a second container connected to the chemical dispense unit via an outlet pipe;
   a first pump, located on a first pipe which connects the first container and the second container, configured to direct the solution stored in the first container to the second container;
   a first filter, located in the first pipe, configured to filter the solution flowing through the first pipe from the first container toward the second container;
   a second pipe configured to connect the first container and the second container; and
   a second pump located on the first pipe;
   wherein the first filter located in the first pipe is positioned between the first pump and the second pump,
   wherein a first bypass pipe, through which the solution flowing from the first container can pass to the first filter, is provided to bypass the first pump, and
   wherein a second bypass pipe, through which the solution flowing from the first filter can pass to the second container, is provided to bypass the second pump,
   wherein the chemical supply method comprises:
   a discharging step of supplying the solution from the second container by opening an open-close valve provided on the outlet pipe; and
   a filtering step of filtering the solution using the first filter by operating the first pump and/or the second pump.

2. The chemical supply method of claim 1, wherein a rate of discharging the solution in the discharging step and a rate of filtering the solution in the filtering step are controlled independently from each other.

3. The chemical supply method of claim 1, wherein in the filtering step, the solution is repeatedly filtered while the solution is circulated through the first container, the first pipe, the second container and the second pipe, in this order.

4. The chemical supply method of claim 1, wherein in the filtering step, a dissolved gas dissolved in the solution is separated and removed from the solution.

5. A chemical supply method implemented by a chemical supply system to dispense a solution from a chemical supply source onto a substrate via a chemical dispense unit;
   wherein the chemical supply system comprises:
   a first container connected to the chemical supply source via an inlet pipe;
   a second container connected to the chemical dispense unit via an outlet pipe;
   a first pump, located on a first pipe which connects the first container and the second container, configured to direct the solution stored in the first container to the second container;
   a first filter, located in the first pipe, configured to filter the solution flowing through the first pipe from the first container toward the second container;
   a second pipe configured to connect the first container and the second container; and
   a second pump located on the first pipe;
   wherein the first filter located in the first pipe is positioned between the first pump and the second pump,
   wherein a first bypass pipe, through which the solution flowing from the first container can pass to the first filter, is provided to bypass the first pump, and wherein a second bypass pipe, through which the solution flowing from the first filter can pass to the second container, is provided to bypass the second pump, wherein the chemical supply method comprises:

a discharging step of supplying the solution from the second container by opening an open-close valve provided on the outlet pipe; and a circulating step of circulating the solution through the first container, the first pipe, the second container and the second pipe, in this order;

wherein the discharging step and the circulating step are performed independently from each other.

\* \* \* \* \*